United States Patent
Chapon et al.

(10) Patent No.: US 9,508,539 B2
(45) Date of Patent: Nov. 29, 2016

(54) GLOW DISCHARGE MASS SPECTROMETRY METHOD AND DEVICE

(71) Applicant: HORIBA JOBIN YVON SAS, Longjumeau (FR)

(72) Inventors: Patrick Chapon, Villebon (FR); Sebastien Legendre, Guyancourt (FR)

(73) Assignee: HORIBA JOBIN YVON SAS, Longjumeau (FR)

( * ) Notice: Subject to any disclaimer, the term of this patent is extended or adjusted under 35 U.S.C. 154(b) by 0 days.

(21) Appl. No.: 14/895,119

(22) PCT Filed: Jun. 17, 2014

(86) PCT No.: PCT/FR2014/051493
§ 371 (c)(1),
(2) Date: Dec. 1, 2015

(87) PCT Pub. No.: WO2014/202892
PCT Pub. Date: Dec. 24, 2014

(65) Prior Publication Data
US 2016/0111270 A1    Apr. 21, 2016

(30) Foreign Application Priority Data
Jun. 17, 2013    (FR) ...................... 13 55667

(51) Int. Cl.
*H01J 49/12*    (2006.01)
*H01J 37/32*    (2006.01)
(Continued)

(52) U.S. Cl.
CPC .......... *H01J 49/12* (2013.01); *H01J 37/32018* (2013.01); *H01J 37/32862* (2013.01); *H01J 49/0031* (2013.01); *H01J 49/40* (2013.01)

(58) Field of Classification Search
CPC ................... H01J 37/32018; H01J 37/32862; H01J 49/0031; H01J 49/12; H01J 49/40
See application file for complete search history.

(56) References Cited

U.S. PATENT DOCUMENTS 6,606,802 B2*    8/2003    Sandhu ............... C23C 16/4405
                                                         34/230
2003/0116706 A1*    6/2003    Wilken .................. H01J 49/10
                                                         250/288

(Continued)

FOREIGN PATENT DOCUMENTS

FR    2 884 964 A    10/2006
FR    2 959 015 A1    10/2011
JP    S62 15747 A    1/1987

OTHER PUBLICATIONS

Molchan, Igor S., et al. "The concept of plasma cleaning in glow discharge spectrometry." Journal of Analytical Atomic Spectrometry 24.6 (2009): 734-741.*

(Continued)

*Primary Examiner* — Wyatt Stoffa
(74) *Attorney, Agent, or Firm* — Young & Thompson

(57) ABSTRACT

A glow discharge mass spectrometry device and method, the device including a glow discharge lamp (1), gas flow-injection elements, the glow discharge lamp being suitable for forming an ablation plasma in the presence of a plasma gas, and a mass spectrometer. The device further includes heating elements (30, 31) suitable for heating a gas flow (38) upstream of a cell (2), the gas flow-injection elements being suitable for injecting into the glow discharge cell a gas flow (38) heated to a temperature T for a duration D, and pumping elements (7, 27) being designed to pump a flow of gaseous species (17, 37) out of the cell for the duration D, so as to decontaminate the surface of the sample (4) and/or the inner walls of the glow discharge cell (2) before an ablation plasma (5) is ignited.

18 Claims, 3 Drawing Sheets

Figure 1:
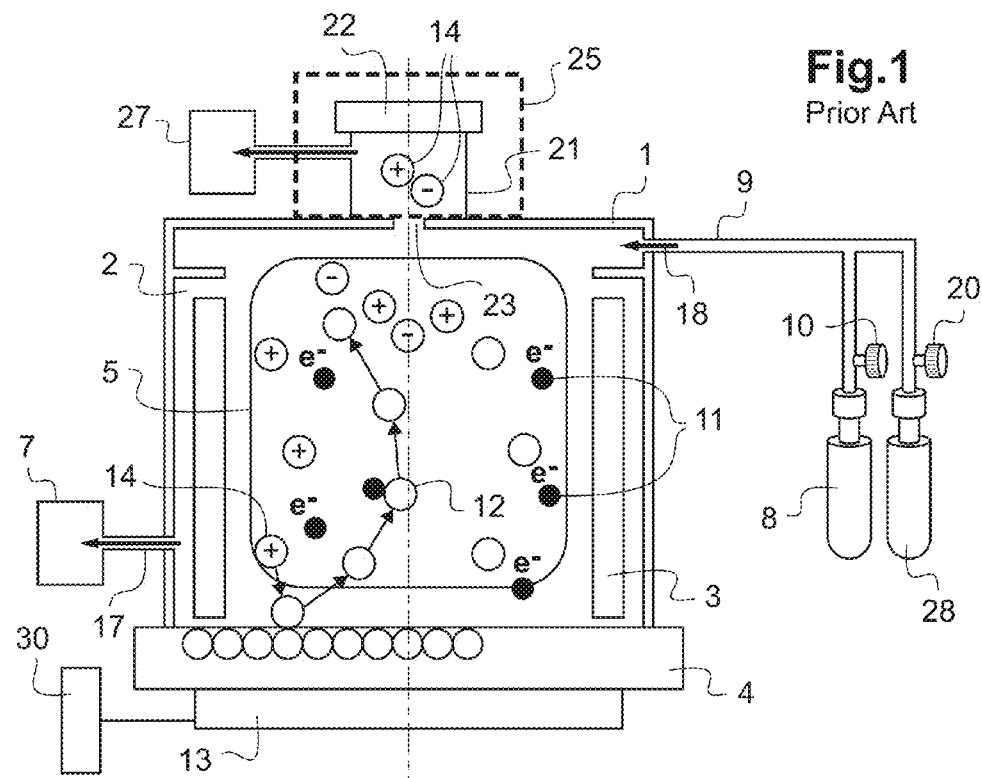

(51) Int. Cl.
*H01J 49/00* (2006.01)
*H01J 49/40* (2006.01)

(56) References Cited

U.S. PATENT DOCUMENTS

| | | |
|---|---|---|
| 2004/0118436 A1 | 6/2004 | Joyce |
| 2004/0134612 A1* | 7/2004 | Numata ............ H01J 37/32522 156/345.37 |
| 2007/0040112 A1* | 2/2007 | Rottmann ............... H01J 49/12 250/288 |
| 2007/0272852 A1 | 11/2007 | Miller et al. |
| 2011/0031392 A1* | 2/2011 | McEwen ............. H01J 49/0477 250/283 |
| 2013/0200257 A1 | 8/2013 | Chapon et al. |
| 2014/0083450 A1* | 3/2014 | Ye ........................... B08B 7/005 134/1 |

OTHER PUBLICATIONS

Jakubowski, Norbert, et al. "Trends in glow discharge spectroscopy." Journal of Analytical Atomic Spectrometry 22.7 (2007): 722-735.*

"Norm ISO—15338 /"Surface chemical analysis—Glow discharge mass spectrometry (GD-MS)—Introduction to use Analyse chimique des surfaces—Spectrometrie de masse GBP a decharge luminescente (GD-MS)—Introduction GBP a l 'utilisation International Standard ISO/IEC, XX, XX, vol. Norm ISO—15338, Jan. 1, 2009, p. 30pp, XP008169139, cited in the application paragraph [9 .1. 2].

International Search Report, dated Nov. 24, 2014, from corresponding PCT application.

* cited by examiner

GLOW DISCHARGE MASS SPECTROMETRY METHOD AND DEVICE

The present invention relates to the Glow Discharge Mass Spectrometry (GD-MS) devices and methods. More precisely, the invention relates to a GD-MS method comprising a step of cleaning or decontaminating the glow discharge lamp and the surface of the sample to be analysed.

Glow discharge mass spectrometry is a technic of analysis that allows to measure the elementary and/or molecular chemical composition of homogeneous or multilayer solid samples. The measurement may be performed internally or be resolved in depth.

The principle of the GD-MS consists in eroding by plasma a relatively wide surface of a sample, then ionizing the eroded chemical species and detecting the ions by mass spectrometry to deduce therefrom the composition of the sample. More precisely, a gas, called plasma gas, is injected into the discharge lamp and an electric power is applied between the anode and the cathode of the lamp to generate a plasma. The plasma gas is generally an inert gas such as argon, neon, krypton or helium. The plasma gas may also be formed of a mixture of gases, for example a mixture of argon with another gas such as oxygen, hydrogen or helium. The surface of the sample placed in the lamp is hence exposed to an ablation plasma. This plasma ensures both the erosion of the solid material to be analysed as well as the excitation and/or the ionization of the species eroded in gaseous phase. A spectrometer allows to analyse the chemical species present in the plasma. As a function of the duration of erosion, the GD-MS allows an analysis of certain samples resolved in depth, hence providing a profile of composition.

The glow discharge mass spectrometry technic is based on the coupling of a glow discharge lamp and a mass spectrometer. There exists different glow discharge mass spectrometry appliances called after the type of glow discharge lamp and the type of spectrometer used.

In particular, a magnetic-sector mass spectrometer or HR-GD-MS or a time-of-flight mass spectrometer or GD-TOFMS is used.

In glow discharge mass spectrometry (GD-MS), a mass spectrometer allows to analyse the ionized chemical species of the plasma as a function of their m/z ratio, where m represents the mass and z the electric charge of the ionized species. The mass analyser separates and transfers the ions to a detector. The detected ions generate an electric current that is measured. The instrument then calculates the elementary fraction of predetermined ions, possibly by comparison with the signals generated by a sample of known composition. The conventional magnetic-sector HR-GD-MS mainly applies to the analysis of conductive metallic materials, and allows to detect the presence of elements in the state of traces at sub-ppb levels.

In glow discharge time-of-flight mass spectrometry (GD-TOFMS), the mass spectrometer receives a flow of ionized species of the plasma and timely separates the ionized species as a function of their mass/charge (m/z) ratio. Coupled to a multichannel detector, the time-of-flight mass analyser hence allows to detect simultaneously or almost-simultaneously all the chemical elements of the mass spectrum of the source of ions and to measure the flows of ions with a good resolution and a high acquisition rate. The GD-TOFMS allows an in-depth resolved analysis of the elementary and molecular profile of materials. For the applications of elementary measurement internally of solid materials, the time-of-flight mass spectrometry is less sensitive than the conventional HR-GD-MS, but it covers an immensely wider field of application.

The GD-MS is relatively simple to use and has various applications. It allows the analysis of elements present as traces, minor or major in metallic or non-metallic solid samples.

However, to reach a high level of sensitivity and accuracy, in particular at the surface of a sample, it is essential to provide stable plasma conditions at the beginning of the erosion of the material.

In a conventional mode of operation in GD-TOFMS, the material to be analysed is generally placed opposite the glow discharge source or lamp, against an O-ring ensuring the sealing. A pumping system allows to obtain a primary vacuum in the GD source. A source of gas, for example a bottle containing argon or a mixture of gases, allows to inject a flow of plasma gas into the discharge lamp. The balance between the flow rate of the pumping system and the flow rate of the plasma gas ensures the holding of a pressure of a few torrs in the GD source. The plasma is then lighted in the GD source in conditions of relatively low pressure, but not in conditions of high vacuum.

However, the presence of contaminants in the plasma gas, on the surface of the sample to be analysed or on the internal walls of the discharge lamp is liable to induce instabilities in the plasma and errors of measurement in glow discharge mass spectrometry, whatever the measurement method is: magnetic-sector or time-of-flight mass spectrometry.

In particular, gaseous impurities such as nitrogen, oxygen, or hydrocarbons and water may lead to the production of parasitic signals due to ions $CO^+$, $CO_2^+$, $H_3O^+$, ArC, $ArCO^+$, $ArH^+$ and to recombinations of these ions, or to ions $MO^+$ and $MH^+$, where M represents a metal to be analysed.

Now, these species may generate parasitic signals or signals interfering with the searched signals. Moreover, these interfering signals are not only present at the lighting of the plasma, but may also appear several tens of seconds after the starting of the ablation plasma. These parasitic or interfering signals may lead to errors of interpretation of the spectrometry measurements, in particular in the case of a mass spectrometry analysis resolved as a function of the depth of the erosion crater.

In particular in the surface analysis applications, it is crucial to track the elements comprising hydrogen (H) and/or oxygen (O) is crucial. For example, it can be mentioned the analysis of oxidized layers at the surface of a sample. The appearance of certain signals may lead to the interpretation of a buried layer under the surface of the sample, whereas they are in reality parasitic signals of contamination.

It is hence essential that the GD-MS measurements show no ambiguity.

Moreover, the presence of hydrated species leads, by recombination, to isobaric interferences on other key elements. For example, in the case of analysis of a metal M by GD-MS, the m/z ratio for an ion composed of $NH_2O^+$ may be very close to the ratio of the ion of the searched metal M (if the ion N has a mass close to the mass of the ion M minus 18). The composed ion that will be called herein, for the sake of simplification, $(M-18)H_2O^+$ then produces a signal of interference that may distort the interpretation of the measurements. These hydrated species must hence be controlled.

Finally, the contaminants generate an unstable background noise that affects the reproducibility of the GD-MS measurements.

A conventional device used to reduce the effects of the impurities in HR-GD-MS consists in cooling down the sample and the walls of the source.

The standard ISO15338 defines a set of recommendations aiming to standardize the practices in the chemical surface analysis by glow discharge mass spectrometry. According to this standard, the implementation of a cryogenic cooling of the glow discharge lamp casing allows to reduce the gaseous impurities (9.1.2 in fine).

On the other hand, the patent document FR2884964-A1 describes the use of Peltier modules to directly or indirectly cool down the sample to be analysed. These Peltier modules allow to regulate the temperature of the sample in a range of temperatures lower than 270K and going to 70K. The cooling down of the sample allows to stabilize the temperature of the sample during the exposure to the plasma, so as to increase the accuracy and the reproducibility of the measurement results. This cooling-down avoids to damage the structure of the sample, due to the heating induced by the ablation plasma, in particular in the case of organic or thin-film samples.

These cooling devices are of course effective but constraining. Indeed, after the HR-GS-MS measurement, a step of bringing each sample back to ambient temperature is generally required before the opening of the lamp, for example for a change of sample. This bringing of the sample back to ambient temperature has for object to avoid the phenomena of condensation due in particular to the presence of humidity in the ambient air. This step of bringing back to ambient temperature may take about ten minutes for each sample and limits greatly the rate of the HR-GD-MS measurements to a few samples per hour (about 3 samples). Moreover, the cooling down of the sample involves mechanical constraints, for example of temperature resistance of the sealing gaskets.

The standard ISO15338 recommends a step of preliminary sputtering (or pre-sputtering) of a certain duration between the lighting of the plasma and the beginning of the HR-GD-MS measurement, in order to remove the contaminants from the surface of the sample before the beginning of the mass spectrometry analysis. This preliminary sputtering step allows to eliminate certain surface interferences.

However, contaminants may remain despite this preliminary sputtering step. Moreover, this preliminary sputtering step is inapplicable when it is desired to perform an in-depth resolved analysis of profile of composition of the sample (depth-profile), where the surface of the sample is pertinent for the analysis.

One object of the invention is to reduce the quantity of contaminant species absorbed or adsorbed by the sample to be analysed and/or by the walls of the cell where the plasma of the glow discharge source is formed. Another object of the invention is to provide a glow discharge mass spectrometry method in which the contaminants are in reduced number, without lengthening the duration of processing of a sample in a glow discharge spectrometer.

It is desirable to propose a glow discharge mass spectrometry appliance that allows to greatly minimize the residuals of water while keeping the simplicity of use of the GD-TOFMS appliances.

The present invention has for object to remedy these drawbacks and relates more particularly to a glow discharge mass spectrometry method comprising the following steps:

a. placing a sample to be analysed by glow discharge mass spectrometry in a cell of a glow discharge lamp;
b. pumping a flow of gaseous species out of said cell;
c. injecting a flow of plasma gas into said cell;
d. applying an electric power to the electrodes of the glow discharge cell so as to light an ablation plasma at the surface of the sample to be analysed;
e. detecting ionized species of the plasma, analysing said ionized species and measuring the detected species by glow discharge mass spectrometry.

According to the invention, the glow discharge mass spectrometry further includes the following steps:

f. heating a gas flow to a temperature T higher than the ambient temperature, higher than the temperature of the sample and/or higher than the internal temperature of the cell;
g. injecting, into the glow discharge cell, said gas flow heated to the temperature T for a duration D, before the step d) of lighting the ablation plasma, and
h. pumping a flow of gaseous species out of said cell for the duration D, so as to decontaminate the surface of the sample and/or the internal walls of the glow discharge cell before the ablation plasma lighting.

The injection of a heated gas flow, even at a moderate temperature T of about 320K, allows to desorb the contaminant molecules from the sample surface and from the inside of the fluid circuit, comprising the gas arrival pipes, the casing of the glow discharge cell, and the pumping pipes. The pumping of the species desorbed by the heated gas flow allows to evacuate the desorbed contaminant species out of the glow discharge cell.

Particularly advantageously, the injection of a hot gas is performed during the period of draining of the system before the lighting of the plasma and does not delay in any way the GD-MS measurement method. The injection of heated gas is particularly effective for the desorption of molecules of water, and allows to strongly reduce the appearance of hydrated parasitic species or oxygen ions that are, in practice, the more embarrassing.

According to various particular and advantageous aspects of the method of the invention:
the heated gas injected at step g) has the same chemical composition as the plasma gas, preferably chosen among a rare gas or a mixture of rare gases or a mixture of a rare gas with another gas;
the heated gas injected at step g) has a chemical composition different from that of the plasma gas;
the temperature T of the heated gas is comprised between 300 K and 400 K, or even 310 and 360 K, and preferably of about 323±10 K;
the duration D is comprised between a few seconds and a few minutes;
the step e) includes a step of detecting and measuring contaminant ionized species among the hydrated species and/or the oxygenated species.

According to a particular embodiment, the method further includes after the step h), a step of interrupting the injection of a gas flow into the cell and a step of vacuum pumping the cell before the steps c) of injecting a plasma gas flow and d) of lighting the ablation plasma. More particularly, in a time-of-flight mass spectrometry method, the step of vacuum pumping the cell comprises opening a slit arranged between the cell and the time-of-flight mass spectrometer and vacuum pumping said cell via pumping means of the time-of-flight mass spectrometer.

The invention also relates to a glow discharge mass spectrometry device comprising:
a glow discharge lamp, comprising a glow discharge cell, electrodes, and an electric supply source adapted to apply an electric power to the electrodes of the glow discharge cell, means for injecting a gas flow into the glow discharge cell, said injection means being connected to the glow discharge cell by fluid connection means and means for pumping a flow of gaseous species out of the glow discharge cell, said glow discharge lamp being adapted to form an ablation plasma at the surface of a sample to be analysed in the presence of a flow of plasma gas in the glow discharge cell, and a mass spectrometer comprising a detector adapted to detect ionized species of the plasma.

According to the invention, the glow discharge mass spectrometry device further includes heating means adapted to heat a gas flow upstream from said glow discharge cell, the gas injection means being adapted to inject, into the glow discharge cell, a gas flow heated to the temperature T for a duration D, and the pumping means being configured to pump a flow of gaseous species out of said cell for the duration D, so as to decontaminate the surface of the sample and/or the internal walls of the glow discharge cell before the lighting of the ablation plasma.

According to various particular and advantageous aspects of the device of the invention:

the heating means are adapted to heat a gas flow to a temperature comprised between 300 K and 400 K, or even between 310 and 360 K, and preferably of about 323±10 K;

the means for heating a gas flow comprise a heating electric resistance, a source of heated air flow or a source of heated liquid, said heating means being arranged in the vicinity of a gas duct connecting a source of gas to the glow discharge cell.

Advantageously, the device further includes cooling means adapted to cool down the sample and/or the glow discharge cell.

The invention will find a particularly advantageous application in glow discharge mass spectrometry applied to the in-depth resolved analysis of materials and thin films.

The present invention also relates to a glow discharge mass spectrometry device comprising a glow discharge lamp, comprising a glow discharge cell, electrodes, and an electric supply source adapted to apply an electric power to the electrodes of the glow discharge cell, means for injecting a flow of plasma gas into the glow discharge cell, said injection means being connected to the glow discharge cell by fluid connection means and means for pumping a flow of gaseous species out of the glow discharge cell, said glow discharge lamp being adapted to form an ablation plasma in presence of a plasma gas in the glow discharge cell, and a spectrometer comprising a detector adapted to detect excited and/or ionized species of the plasma.

According to the invention, the glow discharge mass spectrometry device further includes heated gas injection means adapted to inject, into the glow discharge cell, a flow of gas heated to a temperature T for a duration D, the duration D and the temperature T being adapted to decontaminate the sample and/or the internal walls of the glow discharge cell before the starting of the ablation plasma.

The present invention also relates to the characteristics that will become apparent from the following description and that will have to be considered in isolation or according to any of their technically possible combinations.

The invention hence proposes a method allowing to reduce the negative effects induced by contaminants such as, in particular, molecules of water adsorbed on the surface of a sample to be analysed or on the internal walls of a glow discharge lamp.

Figure 2:
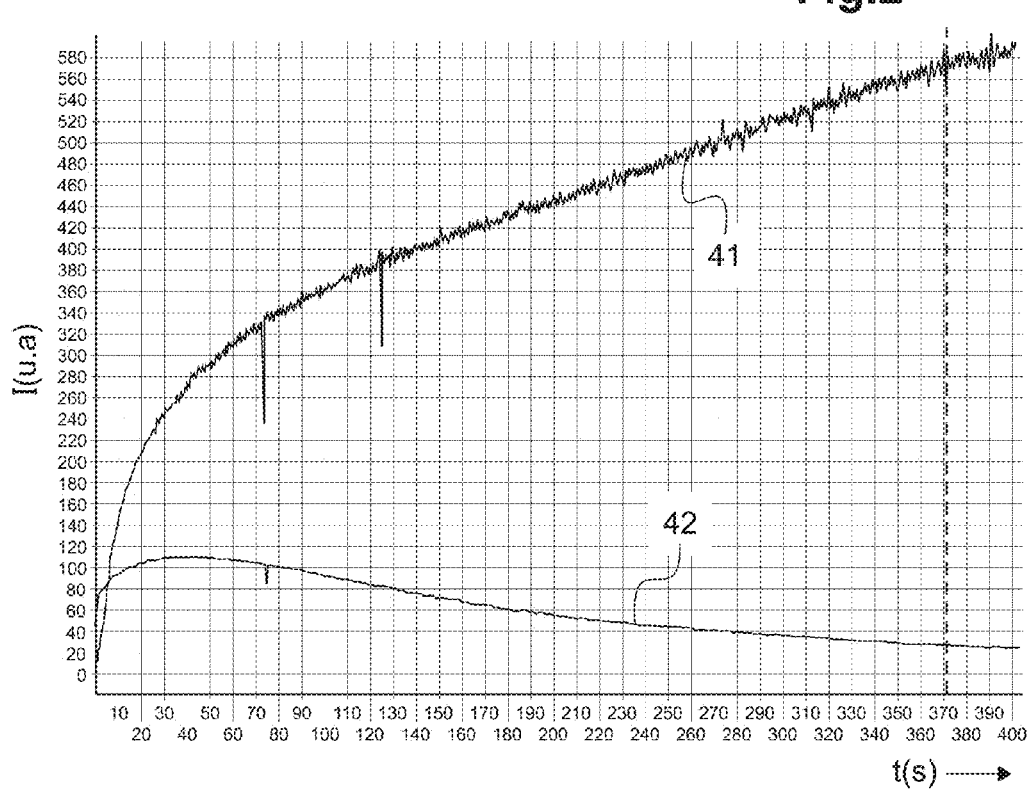
Figure 3:
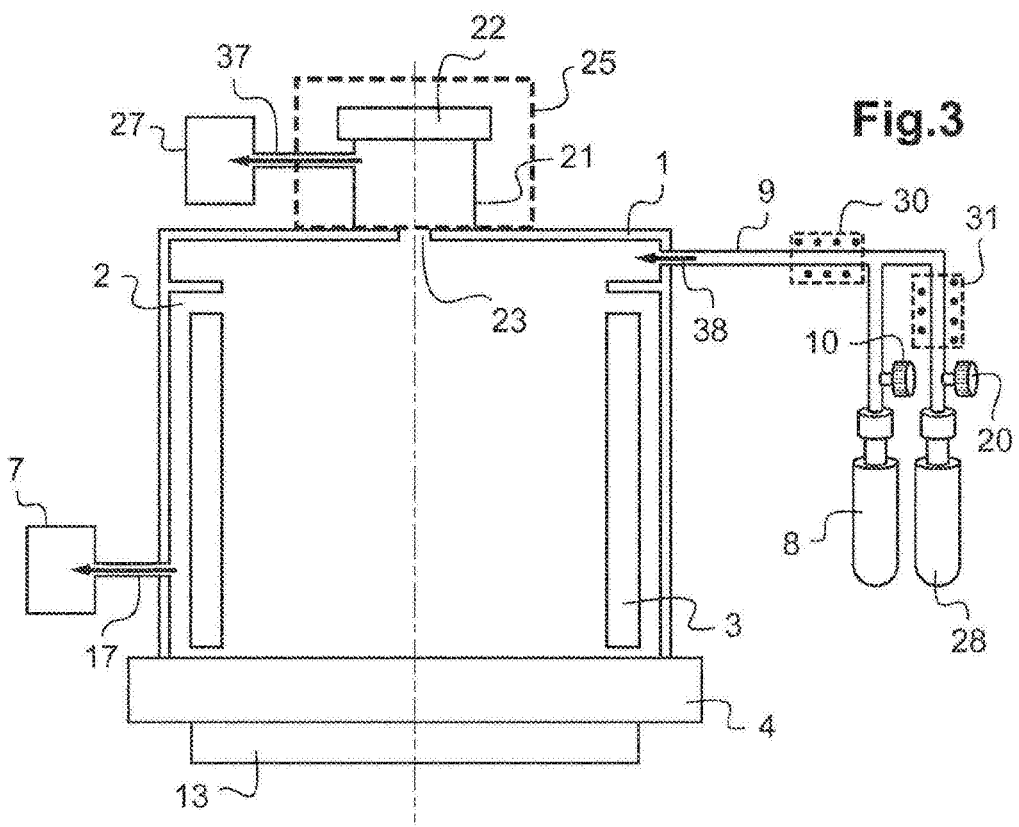
Figure 4:
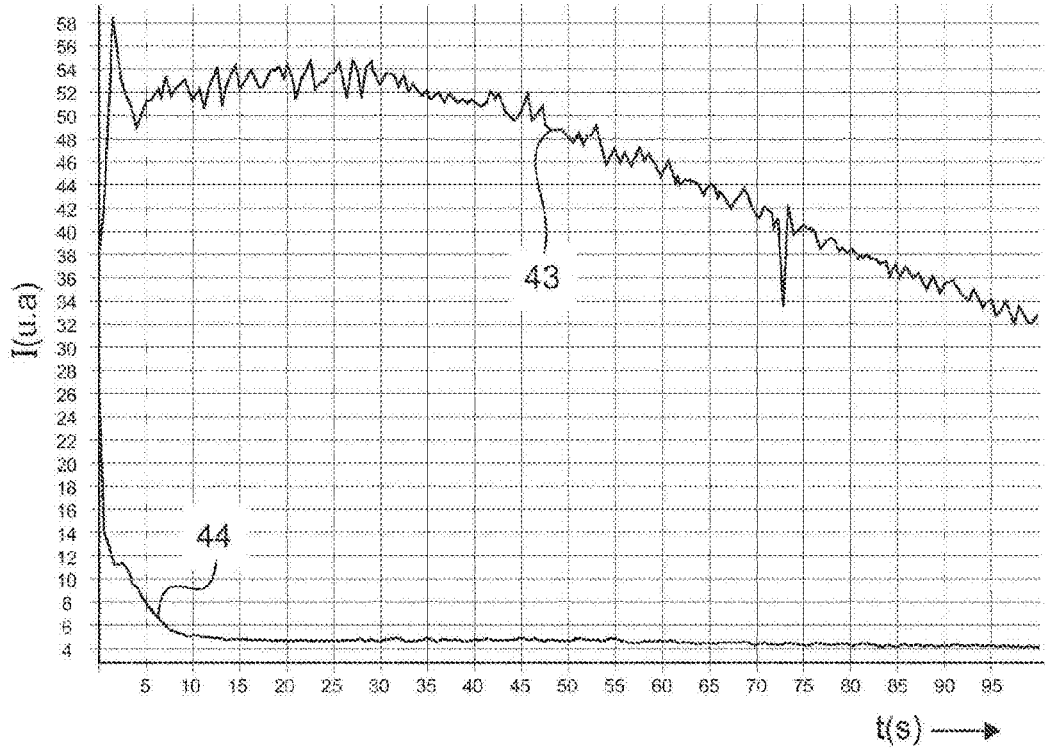
Figure 5:
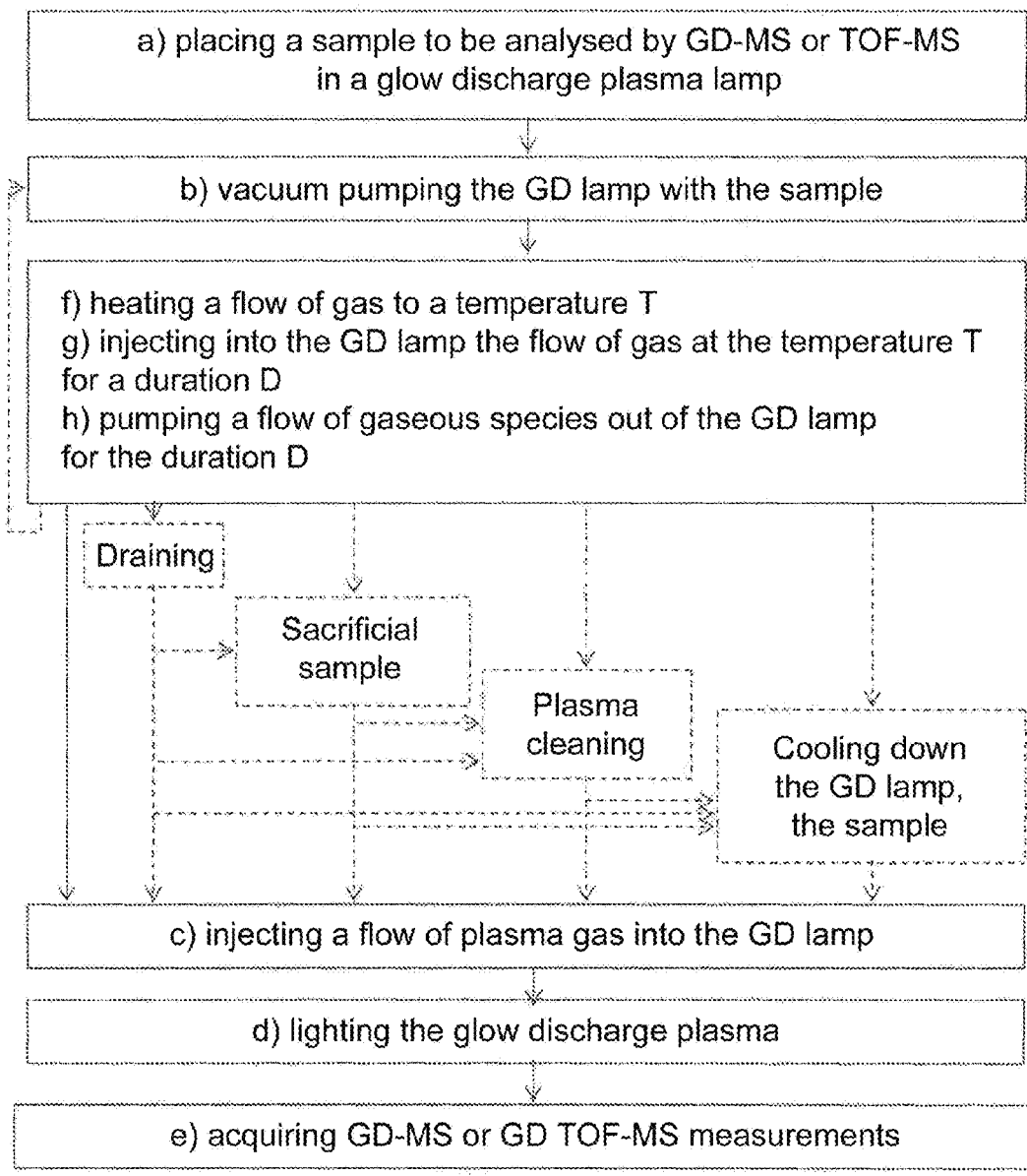

The present description, given only by way of non-limitative example, will allow to better understand how the invention may be implemented with reference to the appended drawings, in which:

FIG. 1 schematically shows a sectional view of a glow discharge lamp according to the prior state of the art;

FIG. 2 shows an example of in-depth measurement of the profile of a homogeneous sample of stainless steel by GD-TOFMS according to the prior art;

FIG. 3 schematically shows a glow discharge mass spectrometry device according to an embodiment of the invention;

FIG. 4 shows GD-TOFMS measurements of signals corresponding to the ion $H_3O^+$ during the exposure of a sample to a glow discharge, GD, plasma, respectively without and with heating of the gas injected into the source before the starting of the plasma;

FIG. 5 schematically shows a diagram of steps of the glow discharge mass spectrometry method according to different variants of the method of the invention.

Different glow discharge mass spectrometry devices (GD-MS for Glow Discharge Mass Spectrometer) exist. A GD-MS appliance generally comprises a mechanical device called "lamp", in which is placed a sample to be analysed, the body of the lamp being connected to a mass spectrometer.

FIG. 1 schematically shows a cross-sectional view of a discharge lamp according to the state of the art. The discharge lamp 1 of the RF anode tube type comprises an anode tube 3 inside a vacuum casing 2. A sample 4 placed in the lamp opposite an end of the anode tube 3 forms the second electrode of the device. A seal arranged between the sample and the body of the lamp generally ensures the sealing of the glow discharge cell.

In the present document, the terms cell and vacuum casing of a glow discharge lamp are understood in an equivalent manner.

A pumping system 7 allows to perform a primary vacuum in the discharge lamp after the sample has been placed, to evacuate the ambient air from the glow discharge cell, via a fluid connection. A gas source 8 is connected by a fluid connection 9 (more precisely, a gas injection duct) to the vacuum casing 2 of the glow discharge lamp, to allow the injection of a plasma gas 18 under a low pressure. The plasma gas 18 is generally an inert gas and preferentially argon, or a mixture of an inert gas with another gas. The gas source is for example a bottle 8 of purified gas, whose rate of contaminants is lower than a determined threshold, for example 5 ppm. A valve 10 allows to open or close the gas supply. By way of non-limitative example, the gas source may be consisted of a mixture of gases coming for example from two bottles 8, 28 of different gases. The second bottle of gas 28 is also connected to a valve 20. The control of the valves 10 and 20 allows to adjust the composition of the plasma gas mixture 18 injected into the casing of the discharge lamp to form an ablation plasma 5. The pumping is continued during the plasma so as to evacuate a flow of gaseous species or pumping flow 17. The plasma gas flow 18 and the pumping flow 17 are regulated so as to maintain the pressure within the casing 2 of the discharge lamp at a relatively low and stable level. An electric generator 30 allows to apply an electric power to the electrodes of the lamp in order to generate a plasma 5. For example, the anode tube 3 being connected to the mass, an applicator 13 in contact with the rear face of the sample delivers the electric power required to maintain an ablation plasma 5. The plasma 5 is generally consisted of electrons 11, of neutral atoms in a fundamental or excited state 12 or ionized species 14. The plasma 5 remains confined inside the anode tube 3. By ionic bombardment, the plasma 5 erodes the surface of the sample 4 arranged opposite the end of the anode tube. By erosion, this plasma 5 forms at the surface of the sample a crater whose diameter is close to the internal diameter of the anode tube. The ionized species 14 present in the plasma 5 are detected and measured by a mass spectrometer 25 via an opening 23 between the cell and the mass spectrometer 25. More particularly, a time-of-flight mass spectrometer comprises a time-of-flight mass analyser 21 and an ion detector 22. The mass analyser 21 separates the ions according to their mass/charge (m/z) ratio, where m represents the atomic mass and z the electric charge of a ionized species. The ion detector 22 counts the ions as a function of time.

The mass spectrometer is in communication with the glow discharge lamp via an opening 23 to allow the passage of the ions 14 of the ablation plasma 5. A differential pumping system 27 coupled to the mass spectrometer 25 generally allows to reach a secondary vacuum ($10^{-5}$ Pa) inside the mass spectrometer, whereas the vacuum casing 2 of the discharge lamp is generally pumped under a primary vacuum ($10^{-1}$ Pa) via the pump 7 and a gas is introduced therein in a controlled manner so that the pressure is established about 665 Pa.

A glow discharge mass spectrometer hence allows to analyse homogeneous solid materials, to analyse deposits at the surface of solid materials, and to analyse thin film stacks. However, the speed of erosion of the GD-MS sources being relatively high (of the order of 2 to 100 nm per second), it is required to have spectrometers allowing a fast acquisition and providing multi-elementary information. This may be obtained using an extremely fast time-of-flight mass spectrometer.

FIG. 2 illustrates an example of in-depth analysis of the profile of composition of a homogeneous sample of stainless steel by GD-TOFMS as a function of the time of exposure to the glow discharge plasma. The analyser of the spectrometer is configured to measure more particularly the signals corresponding to the ferrous metallic element $^{56}Fe$ on the curve 41 and to the molecule of water $^{18}H_2O$ on the curve 42, respectively.

On the curve 41 representing the ferrous element, it is observed a continuous increase of the iron ion signal as a function of time, which corresponds to the aspect of the GD-TOFMS signal expected for a metallic sample uniform in depth.

On the curve 42 of FIG. 2 corresponding to the ion $H_3O^+$ (molecule of water), it is observed a slow increase of the signal up to a maximum of the signal after a duration of ablation plasma of about 40 s, then a slow decrease that continues during several minutes. However, it can be observed that the level of the curve representing the water remains at relatively high level even after several minutes of glow discharge plasma.

The measurement of the single GD-TOFMS signal of the element water (curve 42) may lead to a bad interpretation, by allocating the maximum towards 40 s to in-depth inhomogeneities of the composition of the sample.

The maximum observed on the curve 42 is very probably a signal due to the desorption of molecules of water coming from the walls of the glow discharge cell, after the warming induced by the plasma.

The sources of contamination, in particular the contamination by molecules of water, hence induce not only parasitic peaks but also background noise that distorts the glow discharge mass spectrometry measurements.

Moreover, the hydrated compounds are very easily ionized in the plasma. This signal due to the molecules of water $^{18}H_2O$ is hence very harmful for the correct interpretation of a profile. Furthermore, the presence of hydrated species causes isobaric interferences on other key elements (by recombination), these hydrated species must hence be controlled.

Finally, for the application to the analysis of surface, it is crucial to track the elements H, O and their combinations in the samples to be analysed, for example in the tracking of oxidized layers. It is hence essential that the measurement presents no ambiguity between the elements H, O (and their combinations) coming from the surface material of the sample to be analysed on the one hand, and on the other hand the contaminants coming from the walls or absorbed at the surface of the sample.

As indicated hereinabove, there exist devices using means for cooling down the glow discharge source. These devices use means of cooling, by circulation of water or by Peltier effect module(s) configured to produce a cooling. These cooling means evacuate the heat induced by the plasma on the internal walls of the source and hence avoid any heating of the walls. The contaminants adsorbed on the walls are then not desorbed or degassed.

FIG. 3 schematically shows a glow discharge mass spectrometry device according to an embodiment of the invention.

The device is similar to that of FIG. 1 and further includes heating means 30 and/or 31 adapted to heat a gas flow 38 injected into the casing of the discharge lamp 1 before the lighting of the ablation plasma 5. By way of example, a heating means 31 is located in the vicinity of a gas duct connected to the gas source 28 downstream from the valve 20. Another heating means 30 is located on the gas duct common to the two gas sources 8 and 28. Advantageously, the gas sources may be the same gas sources as those used to generate the ablation plasma 5 and for the analysis of the sample 4 by glow discharge mass spectrometry. Advantageously, the gas sources may be the same gas sources as those used to drain the glow discharge lamp. In another variant, the source(s) of the heated gas flow 38 are different from the plasma gas source(s), wherein the heating gas can be less expensive than the analysis gas, for example argon, which is less pure than nitrogen.

In the device of the invention, as schematically shown in FIG. 3, a heating of gas is ensured by the installation of a heating means 30 and/or 31 located along the gas arrival line 9 that allows to inject a heated gas 38 into the glow discharge lamp before the lighting of the ablation plasma. The gas duct 9 is generally made of stainless steel. This gas duct 9 is connected to the vacuum casing 2 of the discharge lamp 1 by a fluid connection.

In a particular embodiment, the heating means 30 comprises a heating electric resistance arranged around the gas duct 9. By way of example, a heating electric resistance of a power of a few tens to one hundred of Watts is suitable to heat a stainless steel tube of a gas duct and to heat by conduction a gas flow 38 propagating inside the gas duct to be then injected into the vacuum casing 2 of the glow discharge lamp. In an embodiment, the gas duct is hence brought to a temperature of 310 to 330 K, which avoids the contact burns of the operator.

In another variant, the heating means 30 may be consisted of a heated air flow, or a passage of the gas duct 9 in a container containing a liquid heated to a determined temperature. The one skilled in the art will easily adapt the heating means the most adapted to the mounting.

The heating means may comprise one or several electric resistances 30, 31 arranged in the vicinity of one or several gas lines.

The heating means 30 allows to bring the temperature of the gas to a temperature T higher than the ambient temperature, about 292 K.

Advantageously, the temperature T of the heated gas flow 38 is comprised between 300 K and 400 K.

Preferably, the temperature T of the heated gas flow 38 is comprised between 310 K and 360 K, which allows to limit the energetic consumption of the heating.

In a preferred embodiment, the temperature T of the so-heated gas flow is of about 320 K±10 K, which avoids any risk of damaging of the sealing gaskets and the electronic components of the lamp.

The relatively low temperature T avoids any degradation of the sealing gaskets or electronic components of the glow discharge lamp.

A regulation of the temperature T in not indispensable. Indeed, the method proves to be tolerant to the variations of the heating temperature.

Advantageously, the heating means 30 is arranged away from the discharge lamp and in the vicinity of the gas source(s) 8, 28. For example, in the case where the gas source includes a bottle of gas 28, it is particularly advantageous to have a heating means 31 downstream from the gas expansion valve 20. Indeed, the gas is generally stored in a bottle under high pressure ($10^7$ to $2 \cdot 10^7$ Pa) and is injected into the glow discharge lamp under a far lower pressure (a few milli torrs). Now, due to the expansion, the gas is cooled down. By condensation, the cooled-down gas contributes to condensate species such that the molecules of water inside the gas lines and inside the casing 2 of the discharge lamp. Analysing the heating means 30, 31 downstream from the expansion valve 10, 20 of the gas source 8, 28 hence allows to warm the gas flow 38, which then sweeps the whole gas duct 9 up to arriving in the casing 2 of the glow discharge lamp. Hence, the heated gas desorbs the contaminant species liable to be fixed on the internal wall of the gas duct 9 when the casing 2 is open, for example to change the sample 4 to be analysed.

The distance of the heating source also avoids that the heating means increases the temperature of the glow discharge lamp 1 by radiation, which could be harmful for the electronic components and the sealing gaskets of the discharge lamp.

The heated gas flow 38 is injected into the discharge cell for a duration D before the lighting of the ablation plasma. The pumping via the pumping means 7 of the casing 2 is continued during the injection of the heated gas flow 38, so as to evacuate the heated gas and the species that progressively desorb from the walls of the casing 2, the gas ducts 9 and/or the surface of the sample 4. The pressure inside the casing is maintained at a few Torrs during the step of sweeping of the heated gas flow.

In a particularly advantageous manner, the mass spectrometer has differential pumping means 27. During the injection of heated gas, the differential pumping means 27 are used so as to pump a flow of gaseous species 37 through the opening 23 between the casing 2 of the glow discharge lamp and the mass spectrometer 25. This pumping by the pumping means 27 of the mass spectrometer allows to pump under a higher vacuum than by using only the primary pumping means 7 of the casing 2 and hence allows to evacuate contaminants.

Advantageously, the duration D of the sweeping of a heated gas flow in the source before the lighting of the plasma is comprised between a few seconds and a few minutes. The flow rate of heated gas flow is for example of the order of 1 liter per minute, or even lower.

Preferentially, the heated gas 38 has the same chemical composition as the plasma gas 18. In this case, the step c) may be the continuity of step g), or, in other words, the steps f), g) and h) may be followed directly by the step d) of lighting the plasma.

As an alternative, the heated gas may be consisted of another gas or another mixture of gases other than the plasma gas 18.

In an embodiment, the heating of the gas to a temperature T is continued during the ablation plasma. As an alternative, the heating of the gas to a temperature T is interrupted during the ablation plasma.

For example, let's take the case where the plasma gas is consisted of a mixture of gases coming from two different bottles of gas 8, 28. Advantageously, as illustrated in FIG. 3, the heating means 30 is arranged downstream from the junction between the two gas sources, so that the gas mixture can be heated. However, during the phase of injection of gas before the plasma, it may be preferable to use only one source of gas 28, for example nitrogen, which is relatively cheap. In this case, it may be sufficient to arrange a heating means 31 downstream from the gas duct connected to the bottle of nitrogen 28. Only the nitrogen gas is then heated during the phase of injection of heated gas before the lighting of the plasma. During the ablation plasma, a mixture formed for example of nitrogen and of another gas may be injected in the glow discharge lamp. In this case, the gas of the ablation plasma may be heated too thanks to the heating means 30 or, on the contrary, not be heated.

The new device proposed shows advantages of simplicity and ease of implementation. Such a device may be very easily adapted on old appliances already installed.

The injection of heated gas may be continuous or intermittent. The injection of heated gas during the draining phase, before the measurement, may advantageously continue during the GDMS measurement of the sample, when the heated gas has the same composition as the plasma gas.

Complementarily, the device may include means for regulating the gas temperature, for example a temperature probe, arranged in the casing of the plasma source or on a gas duct.

The sample is at an initial temperature of about 293 K and the source has an initial temperature of about 293 K.

The hot gas at the temperature T has for effect to heat the internal walls of the glow discharge lamp by thermal conduction. The injection of hot gas is preferably performed via the plasma gas injection circuit 9. Hence, the hot gas has for effect to heat accurately the area of the surface of the sample 4 that will then be exposed to the ablation plasma 5.

Surprisingly, the injection of hot gas allows to desorb a great part of the molecules of water adsorbed on the surface of the sample, on the internal walls of the glow discharge lamp and probably in the gas tubes of the injection circuit. These effects are observed although the temperature of the hot gas is relatively low, because about ten to about twenty degrees above the ambient temperature are generally enough.

The flow of hot gas hence allows to clean the surface of the sample and the species that are desorbed or degassed from the surface of the sample are pumped via the pumping means 7 of the casing and/or via the pumping means 27 of the mass spectrometer. In particular, the method hence allows to eliminate the molecules of water from the surface of the sample. The flow of hot gas is at a relatively low temperature that generally does not impair the surface of the sample. This step then allows to analyse precisely the composition, in particular at the surface, of the sample. Moreover, the injection of a flow of hot gas 38 has also for effect to heat the whole gas distribution circuit, from the injection to the pumping circuit 7, 27.

It is hence not necessary to implement high-temperature heating means to heat the whole glow discharge source.

In particularly advantageous manner, it is possible to alternate one or several sequences of injection of hot gas and of pumping under a primary vacuum or even under a secondary vacuum, in order to evacuate the contaminants, and in particular the molecules of water. This alternation of draining by heated gas and pumping allows to eliminate more rapidly the contaminants present on the walls of the casing and on the surface of the sample.

When a cycle of hot gas injection and vacuum pumping is applied before lighting the ablation plasma, the pumping is advantageously performed by opening at the maximum the slit-type opening 23 arranged between the mass spectrometer 23 and the glow discharge lamp so as to pump the volume of the casing 2 under a higher vacuum than a primary vacuum. By way of illustrative example, this pumping via the mass spectrometer, in the absence of a glow discharge plasma, allows to reach a residual pressure of about $10^{-4}$ or $10^{-5}$ Pa.

At the end of the steps of heating a gas flow to a temperature T, injecting the heated gas flow and pumping the gaseous species for a duration D, it is possible to resume the conventional method of injecting a flow of plasma gas, lighting the ablation plasma and measuring the ionized species by mass spectrometry.

The ablation plasma may hence be applied to the sample 4 after the steps f), g) and h), and without aeration of the glow discharge lamp casing, hence without contamination of the sample surface.

Complementarily, it is also possible to proceed, after the steps f), g) and h), to one or several steps of draining, plasma ablation of a sacrificial sample, for example made of crystalline silicon, plasma cleaning and/or cooling down of the discharge lamp or of the sample.

The effect of the hot gas injection method may be evaluated on different examples of analysis of samples by glow discharge mass spectrometry.

FIG. 4 illustrates measurements of ion $H_3O^+$ by GD-TOFMS as a function of time, during the exposure of a sample of stainless steel to a glow discharge plasma. In FIG. 4, the curve 43 corresponds to the GD-TOFMS measurement of the ion $H_3O^+$ with no heating of the plasma gas before the injection thereof into a discharge lamp; the curve 44 corresponds to the GD-TOFMS measurement of the ion $H_3O^+$ with heating of the plasma gas before the injection thereof into a discharge lamp. These two curves 43, 44 are obtained other things being equal: same type of sample, same GD-TOFMS appliance, same plasma gas, same conditions of pressure, of gas flow rate, etc.

It is observed in FIG. 4 that the level of the ion $H_3O^+$ of the curve 43 "with no injection of hot gas before the ablation plasma" is relatively high at the starting of the plasma, this level has a maximum after about 25 seconds of plasma, then this level decreases as a function of the duration of the ablation plasma with a fall of about 40% after 90 s. This signal of the ion $H_3O^+$ however remains very high. The maximum after 25 s of ablation plasma corresponds to the desorption of molecules of water induced by the heating of the walls of the source by the plasma during the measurement. Such a maximum could also be interpreted incorrectly.

For the measurement of the curve 44 "with injection of hot gas before the ablation plasma", the injection of hot gas is performed during the phase of draining of the discharge lamp before the erosion plasma. The flow of hot gas is hence placed into contact with all the walls that thereafter intervene in the generation of the plasma. The plasma may then be lighted with the same plasma gas as the gas used as the draining hot gas. Advantageously, the same gas or the same gas mixture is used for the step of hot gas injection before the plasma and as plasma gas during the step of plasma erosion. In this case, it is preferable to maintain the temperature of the plasma gas at the same temperature as the temperature of the hot gas, so as to stabilize the temperature of the system.

By comparison, it is observed on the curve 44 "with injection of hot gas" of FIG. 4 that the level of the ion $H_3O^+$ is considerably reduced from the starting of the plasma (decrease by a factor of about 10 with respect to the initial level of the curve with no heating), this level rapidly decreasing within the first twenty seconds of the plasma to stabilise at a level corresponding to a few percents. The signal of the ion $H_3O^+$ is hence significantly reduced by the injection of a heated gas into the glow discharge lamp before the starting of the ablation plasma.

The contamination signals are divided by a factor almost equal to 10, which indicates a drastic decrease of the contamination by the molecules of water.

Such a result being not in any way foreseeable nor expected, due to the relatively low temperature of the hot gas (~323 K), of the low pressure of the gas in the source (lower than the atmospheric pressure) and of the short duration of the step of draining by injection of the heated gas. By comparison, the effects of the plasma produce direct thermal exchanges with a temperature of plasma that may be very high, but it is observed that the desorption of ions lasts a very long time in an ablation plasma with no heating of the plasma gas.

The step of heating the plasma gas may also be combined with different devices and methods such that: the use of a sacrificial sample, a step of plasma cleaning, of draining of the gas lines and of the source.

According to a particular embodiment, a sacrificial sample is used, for example made of crystalline silicon, that is exposed to a draining by a gas heated to a temperature T and for a duration D. This draining phase in presence of a sacrificial sample allows to evacuate most of the contaminant molecules, without risking to expose the sample to be analysed. One or several sequences of draining, possibly alternated with steps of pumping the glow discharge lamp casing under a primary vacuum. The use of a sacrificial sample is particularly interesting in the case where the sample to be analysed is very fragile (organic material, thin films . . . ) and does not support a high temperature of plasma gas, unlike the sacrificial sample. It is then advantageous to drain the glow discharge lamp in the presence of a sacrificial sample by injecting the gas heated to a temperature as high as possible (370-400 K).

Then, the ablation plasma is lighted so as to expose the surface of the sacrificial sample. By glow discharge mass spectrometry in the presence of the sacrificial sample, it is possible to detect the presence of residual contaminants, to identify and to measure the quantity of these residual contaminants. In a manner known per se, the erosion on a sacrificial sample, for example made of silicon, allows to deposit a layer of known elements on the walls of the glow discharge lamp. Based on this GD-TOFMS measurement on a sacrificial sample, it is then possible, if necessary, to repeat the step(s) of draining by a hot gas. Thereafter, the sacrificial sample is replaced by the sample to be analysed. A step of draining with a hot gas is applied in the presence of the sample to be analysed. In the case of a little resistant to temperature sample, the surface of the sample to be analysed is cleaned by passing a flow of gas at the more moderated temperature (for example of about 320 K) than in presence of the sacrificial sample.

The very important impact of the contamination by the species absorbed is observed, in particular GD-TOFMS. The injection of hot gas before the plasma allows a strong reduction of the contaminants (residual signals of O, H and OH).

FIG. 5 schematically shows a diagram of steps of the glow discharge mass spectrometry method according to a preferred embodiment (shown by full-line arrows and blocks) and different variants of the method of the invention (dash-line arrows and blocks).

The step a) is a conventional step of placing the sample in the casing 2 of the glow discharge lamp 1. Generally, the sample is applied against a sealing gasket to close the vacuum casing 2.

The step b) is also a conventional step of vacuum pumping the glow discharge lamp 1 in the presence of the sample 4.

Instead of the conventional step of draining the discharge lamp in the presence of the sample, by injecting a flow of plasma gas and pumping this flow of plasma gas for a duration D before the lighting of the plasma, the method includes the following steps:

f) heating a flow of gas to a temperature T;

g) injecting into the discharge lamp a flow of gas at the temperature T for a duration D; and h) pumping a flow of gaseous species out of the glow discharge lamp during at least the duration D.

The invention is hence based on the injection of a heated gas, preferably the plasma gas, that is heated previously to its injection into the glow discharge lamp.

The conventional method may then be resumed by injecting the plasma gas into the discharge lamp (step c), lighting the ablation plasma (step d) and, concomitantly with steps c) and d), acquiring the mass spectrometry measurements, of the HR-GD-MS or time-of-flight GD-TOFMS type (step e).

Complementarily, the method may include a step of draining the plasma lamp, for example when the gas used for the steps f) to h) is different from the plasma gas.

For example, this draining step consists, after the step h), in interrupting the injection of the flow of heated gas into the cell and in vacuum pumping the cell, before passing to steps c) of injecting a flow of plasma gas and d) of lighting the ablation plasma. Particularly advantageously, in the case of a time-of-flight mass spectrometer, the slit (23) arranged between the time-of-flight mass spectrometer and the discharge lamp is open, so as to use the differential pumping means (27) of the TOFMS to pump the cell under a vacuum able to reach $10^{-4}$ to $10^{-5}$ Torr. In a variant, the steps f), g) and h) and a step of vacuum pumping are cyclically repeated before applying the steps c) of injecting the plasma gas and d) of lighting the plasma. The fact to apply one or several cycles of injection of heated gas and vacuum pumping allows to accelerate the method of decontamination of the discharge lamp and of the surface of the sample and to reach a lower level of residual contamination.

In a variant, the method further includes a step of ablation of a sacrificial sample, for example made of crystalline silicon, so as to cover the internal walls of the discharge lamp with a known inert layer. In another variant, the method further includes a step of cleaning the lamp with plasma, for example by hiding the sample behind a shutter. In another variant, the method further includes a step of cooling down the sample, before lighting the ablation plasma, so as to keep constant the temperature of the sample during its exposure to the ablation plasma. These variants may be used alone or in combination.

The device and the method of the invention involve little modifications on a conventional discharge lamp because they involve no constraint of high vacuum, and no constraint linked to a wide range of temperatures. The method of heating a gas flow consumes a little energy and the steps f), g) and h) consume no additional time of use of the device.

Indeed, the steps f), g) and h) are preferably performed during the conventional phase of draining of a glow discharge lamp, which avoids to lengthen the time required for analysing a sample. The method is compliant with a high measurement rate, going up to several tens of sample per hour. No idle time for bringing back to ambient temperature a sampled cooled down to a low temperature is required.

The invention applies in particular to a discharge lamp coupled to a time-of-flight mass spectrometer (TOFMS), to a magnetic-sector mass spectrometer, or to a quadripolar mass spectrometer, or to any other model of mass spectrometer.

The invention claimed is:

1. A glow discharge mass spectrometry method comprising the following steps:
  a. placing a sample to be analyzed by glow discharge mass spectrometry in a cell of a glow discharge lamp;
  b. pumping a flow of gaseous species out of said cell;
  c. injecting a flow of plasma gas into said cell;
  d. applying an electric power to the electrodes of the glow discharge cell so as to light an ablation plasma at the surface of the sample to be analyzed;
  e. detecting ionized species of the plasma, analyzing said ionized species and measuring the species detected by glow discharge mass spectrometry;
  wherein said glow discharge mass spectrometry method further includes the following steps:
  f. heating a gas flow to a temperature T higher than the ambient temperature;
  g. injecting, into the glow discharge cell, said flow of gas heated to the temperature T for a duration D before the step d) of lighting the ablation plasma; and
  h. pumping a flow of gaseous species out of said cell for the duration D, so as to decontaminate the surface of the sample and/or the internal walls of the glow discharge cell before the lighting of the ablation plasma.

2. The glow discharge mass spectrometry method according to claim 1, wherein the heated gas injected at step g) has the same chemical composition as the plasma gas.

3. The glow discharge mass spectrometry method according to claim 1, wherein the temperature T of the heated gas is between 300 K and 400 K.

4. The glow discharge mass spectrometry method according to claim 1, further comprising, after step h), a step of interrupting the injection of a gas flow into the cell and a step of vacuum pumping the cell before the steps c) of injecting a flow of plasma gas and d) of lighting the ablation plasma.

5. The glow discharge mass spectrometry method according to claim 4, wherein the step of vacuum pumping the cell comprises the opening of a slit arranged between the cell and the time-of-flight mass spectrometer and the vacuum pumping of said cell via pumping means of the time-of-flight mass spectrometer.

6. The glow discharge mass spectrometry method according to claim 1, wherein the heated gas injected at step g) has a chemical composition different from that of the plasma gas.

7. The glow discharge mass spectrometry method according to claim 6, wherein the temperature T of the heated gas is between 300 K and 400 K.

8. The glow discharge mass spectrometry method according to claim 6, further comprising, after step h), a step of interrupting the injection of a gas flow into the cell and a step of vacuum pumping the cell before the steps c) of injecting a flow of plasma gas and d) of lighting the ablation plasma.

9. The glow discharge mass spectrometry method according to claim 6, wherein the temperature T of the heated gas is 323±10 K.

10. The glow discharge mass spectrometry method according to claim 1, wherein the heated gas injected at step g) has the same chemical composition as the plasma gas, chosen from the group consisting of a rare gas, a mixture of rare gases, and a mixture of a rare gas with another gas.

11. The glow discharge mass spectrometry method according to claim 1, wherein the temperature T of the heated gas is 323±10 K.

12. A glow discharge mass spectrometry device comprising:
a glow discharge lamp, comprising a glow discharge cell, electrodes, and an electric supply source adapted to apply an electric power to the electrodes of the glow discharge cell, means for injecting a gas flow into the glow discharge cell, said injection means being connected to the glow discharge cell by fluid connection means and means for pumping a flow of gaseous species out of the glow discharge cell, said glow discharge lamp being adapted to form an ablation plasma at the surface of a sample to be analyzed in the presence of a flow of plasma gas in the glow discharge cell,
a mass spectrometer comprising a detector adapted to detect ionized species of the plasma,
wherein the glow discharge mass spectrometry device further includes:
heating means adapted to heat a gas flow upstream from said glow discharge cell, the gas injection means being adapted to inject, into the glow discharge cell, a flow of gas heated to the temperature T for a duration D, and the pumping means are configured to pump a flow of gaseous species out of said cell for the duration D, so as to decontaminate the surface of the sample and/or the internal walls of the glow discharge cell before the lighting of the ablation plasma.

13. The glow discharge mass spectrometry device according to claim 12, wherein the heating means are adapted to heat a flow of gas to a temperature between 300 K and 400 K.

14. The glow discharge mass spectrometry device according to claim 13, wherein the means for heating a flow of gas comprise a heating electric resistance, a source of heated air flow or a source of heated liquid, said heating means being arranged in the vicinity of a gas duct connecting a source of gas to the glow discharge cell.

15. The glow discharge mass spectrometry device according to claim 13, further comprising cooling means adapted to cool down the sample and/or the glow discharge cell.

16. The glow discharge mass spectrometry device according to claim 12, wherein the means for heating a flow of gas comprise a heating electric resistance, a source of heated air flow or a source of heated liquid, said heating means being arranged in the vicinity of a gas duct connecting a source of gas to the glow discharge cell.

17. The glow discharge mass spectrometry device according to claim 12, further comprising cooling means adapted to cool down the sample and/or the glow discharge cell.

18. The glow discharge mass spectrometry device according to claim 12, wherein the heating means are adapted to heat a flow of gas to a temperature comprised is 323±10 K.

* * * * *